United States Patent
Torii et al.

(10) Patent No.: US 9,600,364 B2
(45) Date of Patent: Mar. 21, 2017

(54) MEMORY CONTROLLER, STORAGE DEVICE AND DECODING METHOD

(71) Applicant: Kabushiki Kaisha Toshiba, Minato-ku (JP)

(72) Inventors: Osamu Torii, Setagaya (JP); Haruka Obata, Ota (JP); Ryo Yamaki, Yokohama (JP); Daiki Watanabe, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 17 days.

(21) Appl. No.: 14/832,023

(22) Filed: Aug. 21, 2015

(65) Prior Publication Data

US 2016/0266968 A1    Sep. 15, 2016

Related U.S. Application Data

(60) Provisional application No. 62/130,335, filed on Mar. 9, 2015.

(51) Int. Cl.
*H03M 13/00* (2006.01)
*G06F 11/10* (2006.01)
*G11C 29/52* (2006.01)
*H03M 13/29* (2006.01)

(52) U.S. Cl.
CPC ........ *G06F 11/1068* (2013.01); *G11C 29/52* (2013.01); *H03M 13/2909* (2013.01)

(58) Field of Classification Search
CPC . G06F 11/1069; G11C 29/52; H03M 13/2909
See application file for complete search history.

(56) References Cited

U.S. PATENT DOCUMENTS

| 8,261,170 B2 | 9/2012 | Yedidia et al. |
| 8,301,979 B2 | 10/2012 | Sharon et al. |
| 8,826,096 B2 | 9/2014 | Moon et al. |
| 9,214,964 B1 * | 12/2015 | Varnica ............. H03M 13/2909 |
| 9,490,849 B1 * | 11/2016 | Varnica ............. H03M 13/2909 |

OTHER PUBLICATIONS

Ramesh Mahendra Pyndiah "Near-Optimum Decoding of Product Codes: Block Turbo Codes", IEEE Transactions on Communications, vol. 46, No. 8, Aug. 1998, 8 pages.

* cited by examiner

*Primary Examiner* — Sam Rizk
(74) *Attorney, Agent, or Firm* — Oblon, McClelland, Maier & Neustadt, L.L.P.

(57) ABSTRACT

According to an embodiment, a row decoder to perform row decoding by using, as row soft input information, a row received word read as soft determination information from a non-volatile memory and to calculate row extrinsic information and a column decoder to perform column decoding by using column soft input information, which is a result of adding of the row extrinsic information to a column received word read as soft determination information from the non-volatile memory, and to calculate column extrinsic information are included. The row decoder includes a first decoder for first decoding, a second decoder for second decoding a decoding method of which is different from that of the first decoding, and a selection unit to select a decoded result based on accuracy of a decoded result of the first decoding and that of a decoded result of the second decoding and to calculate the row extrinsic information.

20 Claims, 6 Drawing Sheets

MEMORY CONTROLLER, STORAGE DEVICE AND DECODING METHOD

CROSS-REFERENCE TO RELATED APPLICATIONS

This application is based upon and claims the benefit of priority from U.S. Provisional Application No. 62/130,335, filed on Mar. 9, 2015; the entire contents of which are incorporated herein by reference.

FIELD

Embodiments described herein relate generally to a memory controller, a storage apparatus, and a decoding method.

BACKGROUND

Generally, in a storage apparatus, in order to protect stored data, error correction encoding is performed when data is stored. As an example of error correction encoding, a product code to generate a code word two-dimensionally has been known.

DETAILED DESCRIPTION

According to the present embodiment, a memory controller includes a row decoder configured to perform row decoding by using, as row soft input information, a row received word read as soft determination information from a non-volatile memory and to calculate row extrinsic information, and a column decoder configured to perform column decoding by using column soft input information, which is a result of adding of the row extrinsic information to a column received word read as soft determination information from the non-volatile memory, and to calculate column extrinsic information. The row decoder includes a first decoder configured to perform first decoding, a second decoder configured to perform second decoding a decoding method of which is different from that of the first decoding, and a selection unit configured to select a decoded result based on accuracy of a decoded result of the first decoding and accuracy of a decoded result of the second decoding and to calculate row extrinsic information.

In the following, a memory controller, a storage apparatus, and a decoding method according to an embodiment will be described in detail with reference to the attached drawings. Note that the present invention is not limited to this embodiment.

Figure 1:
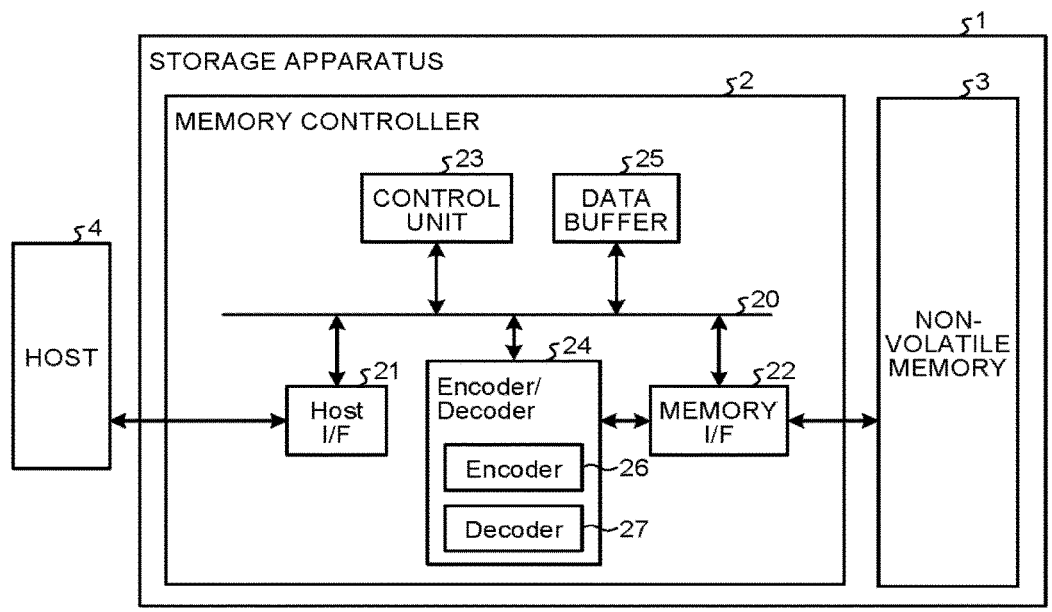
FIG. 1 is a block diagram illustrating a configuration example of a storage apparatus according to an embodiment.

FIG. 1 is a block diagram illustrating a configuration example of a storage apparatus according to an embodiment. A storage apparatus 1 of the present embodiment includes a memory controller 2 and a non-volatile memory 3. The storage apparatus 1 can be connected to a host 4. In FIG. 1, a state being connected to the host 4 is illustrated. The host 4 is, for example, an electronic device such as a personal computer or mobile phone.

The non-volatile memory 3 is a non-volatile memory to store data in a non-volatile manner and is, for example, a NAND memory. Note that here, an example in which a NAND memory is used as the non-volatile memory 3 will be described. However, a storage unit, which is other than the NAND memory, such as a flash memory having a three-dimensional structure, a resistance random access memory (ReRAM), or a ferroelectric random access memory (FeRAM) may be used as the non-volatile memory 3. Also, here, an example in which a semiconductor memory is used as the storage unit will be described. However, error correction processing of the present embodiment may be applied to a storage apparatus in which a storage unit other than the semiconductor memory is used.

The storage apparatus 1 may be a memory card or the like in which the memory controller 2 and the non-volatile memory 3 are configured as one package or may be a solid state drive (SSD) or the like.

The memory controller 2 controls writing into the non-volatile memory 3 according to a write command (request) from the host 4. Also, reading from the non-volatile memory 3 is controlled according to a read command from the host 4. The memory controller 2 includes a host interface (host I/F) 21, a memory interface (memory I/F) 22, a control unit 23, an encoder/decoder 24, and a data buffer 25. The host I/F 21, the memory I/F 22, the control unit 23, the encoder/decoder 24, and the data buffer 25 are connected to each other through an inner bus 20.

The host I/F 21 performs processing according to an interface standard with the host 4 and outputs a command received from the host 4, user data, or the like to the inner bus 20. Also, the host I/F 21 transmits user data read from the non-volatile memory 3, a response from the control unit 23, or the like to the host 4. Note that in the present embodiment, data written into the non-volatile memory 3 in response to the write request from the host 4 is referred to as user data.

The memory I/F 22 performs writing processing into the non-volatile memory 3 based on an instruction from the control unit 23. Also, based on an instruction from the control unit 23, the memory I/F 22 performs reading processing from the non-volatile memory 3.

The control unit 23 is a control unit to totally control components of the storage apparatus 1. When receiving a command from the host 4 through the host I/F 21, the control unit 23 performs control corresponding to the command. For example, according to a command from the host 4, the control unit 23 instructs the memory I/F 22 to write user data and parity into the non-volatile memory 3. Also, according to a command from the host 4, the control unit 23 instructs the memory I/F 22 to read user data and parity from the non-volatile memory 3.

Also, when receiving a write request from the host 4, the control unit 23 determines a storage region (memory region)

on the non-volatile memory 3 with respect to the user data accumulated into the data buffer 25. That is, the control unit 23 manages a writing destination of the user data. A correspondence between a logical address of the user data received from the host 4 and a physical address indicating a storage region on the non-volatile memory 3, where the user data is stored, is stored as an address conversion table.

Also, when receiving a read request from the host 4, the control unit 23 converts a logical address designated by the read request into a physical address by using the above-described address conversion table and instructs the memory I/F 22 to perform reading from the physical address.

In the NAND memory, generally, writing and reading are performed in a data unit called a page and deleting is performed in a data unit called a block. In the present embodiment, a plurality of memory cells connected to the same word line is referred to as a memory cell group. When a memory cell is a single-level cell (SLC), one memory cell group corresponds to one page. When a memory cell is a multi-level cell (MLC), one memory cell group corresponds to a plurality of pages. Also, each memory cell is connected to both of a word line and a bit line. Each memory cell can be identified by an address to identify a word line and an address to identify a bit line.

The data buffer 25 temporarily stores the user data which is received by the memory controller 2 from the host 4 until the data is stored into the non-volatile memory 3. Also, the data buffer 25 temporarily stores user data read from the non-volatile memory 3 until the data is transmitted to the host 4. The data buffer 25 includes, for example, a general memory such as a static random access memory RAM) or a dynamic random access memory (DRAM).

The user data transmitted from the host 4 is transferred to the inner bus 20 and stored into the data buffer 25. The encoder/decoder 24 encodes the data stored in the non-volatile memory 3 and generates a code word. The encoder/decoder 24 includes an encoder 26 and a decoder 27. A detail of encoding and decoding in the present embodiment will be described later.

Generally, in a storage apparatus, a method to protect stored data by an error correction code has been known. More specifically, as the error correction code, a code including a plurality of constraint conditions such as a product code, which is formed by a combination of plurality of block codes, or a concatenated code may be used.

Also, generally, as a method decoding, there are hard-input hard-output (HIHO) decoding and soft-input soft-output (SISO) decoding. The SISO decoding has a higher error correction capability than the HIHO decoding but takes longer processing time. In a case of using a product code, the HIHO decoding or the SISO decoding is performed in the decoding. In a case of performing the SISO decoding, for example, when a product code including a code word group in two dimensions which are a first dimension (row direction and horizontal direction) and a second dimension (column direction and vertical direction) is decoded, processing to calculate extrinsic information (row extrinsic information) in the first dimension by performing the SISO decoding of a code in the first dimension, to calculate extrinsic information (column extrinsic information) in the second dimension by performing the SISO decoding of a code in the second dimension by using the extrinsic information (row extrinsic information) in the first dimension, to calculate extrinsic information in the first dimension by performing the SISO decoding of a code in the first dimension by using the extrinsic information in the second dimension, . . . is iteratively performed. In such a manner, by exchanging extrinsic information in decoding of codes in different dimensions, it is possible to improve an error correction capability. Note that the extrinsic information is information indicating likelihood and a detail thereof will be described later.

Here, how words (channel information, priori information, posteriori information, and extrinsic information) generally used in the soft determination decoding are associated to data stored in the storage apparatus of the present embodiment will be described. As described later, in a case of reading data from the non-volatile memory 3, a range in which a value a threshold voltage in each memory cell in the non-volatile memory 3 is included is calculated by performing threshold determination processing for a plurality of number of times while changing read levels, that is, read voltages. Here, the range is expressed as a variable number a. A logarithm ratio of a conditional probability $P(a|x=0)$, in which a value of a threshold voltage is included in the range a under a condition in which a write bit x into each memory cell is logical 0, and a conditional probability $P(a|x=1)$ in which a value of the threshold voltage is included in the range a under a condition in which the write bit x into each memory cell is a logical 1 will be referred to as channel information. Here, an expression is $\ln(P(a|x=0)/P(a|x=1))$. Here, in indicates a natural logarithm.

It is assumed that a vector X which is write data and which includes a plurality of bits is one code word of a certain error correction code. Here, $X \in C$ indicates that the vector X is one code word of a certain error correction code C. When a probability $P(x=0)$ in which each bit x is zero and a probability $P(x=1)$ in which x is one are known from a condition different from the code constraint C or the read range a of the threshold voltage, a logarithm ratio of probabilities will be referred to as a priori information in the present performance. An expression is $\ln(P(x=0)/P(x=1))$.

Generally, the soft determination decoding is a method to calculate a vector X to maximize a posteriori probability $P(X \in C|A)$ or a method to give a solution approximate thereto under a condition in which a vector A which includes a read range of a threshold voltage as an element and which corresponds to a code word of C, a conditional probability $P(A|x)$ of a channel, and a vector of a priori information in a case of being already acquired) are given.

Also, a logarithm ratio of a conditional probability $P(x=0, X \in C|A)$ in which the write bit x in each memory cell is zero and a conditional probability $P(x=1, X \in C|A)$ in which a write bit in each memory cell is one under a condition of receiving the vector A will be referred to as a posteriori information in the present performance. An expression is $\ln(P(x=0, X \in C|A)/P(x=1, X \in C|A))$.

Information which can be acquired by subtracting channel information and a priori information from a posteriori information with respect to each bit will be referred to as extrinsic information.

More specifically, as the SISO decoding method, there are various methods. For example, there is chase decoding. In a property of the chase decoding, a relatively high correction capability (compared to different decoding method) is acquired in a channel where an error with large amplitude is generated frequently. On the other hand, a correction capability is not acquired relatively when an error with large amplitude is not generated frequently. A property varies depending on a decoding method. There is a decoding method having an opposite property of the chase decoding, that is, a property in which a correction capability is relatively decreased when an error with large amplitude is generated frequently but a relatively high correction capability can be acquired when an error with large amplitude is not generated frequently. When a property of generation of an error in a channel is already known and there is no variation, a decoding method suitable for the channel is used. However, a state of the channel generally varies, and thus, a decoding method suitable for the channel is not necessarily fixed. Note that in the present embodiment, amplitude of an error indicates a deviation amount of a threshold voltage corresponding to original data written by a threshold voltage of a memory cell of the non-volatile memory 3. Thus, an error with large amplitude means a great deviation from a threshold voltage corresponding to original data written by the threshold voltage of the memory cell of the non-volatile memory 3. The above-described property is an example. There are decoding methods with various properties. There are decoding methods in a complementary relationship.

A channel of the present embodiment is a path to write data into the non-volatile memory 3 and to read data from the non-volatile memory 3. A property from writing into the non-volatile memory 3 to reading therefrom depends on a stress or the like applied to the non-volatile memory 3. There are various stresses applied to the non-volatile memory 3 such as a writing stress, a reading stress, and a deleting stress. A property of generation of an error varies depending on these stresses. Thus, a decoding method suitable for the channel may vary according to a state of a stress. Thus, in the present embodiment, decoding is performed by using a plurality of decoding methods in a case of performing decoding of each of a code in the first dimension and a code in the second dimension (hereinafter, referred to as component code). Then, the most accurate result is selected from a plurality of acquired decoded results. Accordingly, an error correction capability can be improved. A detail of the SISO decoding of the present embodiment will be described later.

In the following, reading and writing processing including encoding and decoding processing of the present embodiment will be described. Here, a description will be made with a product code generated by a combination of block codes in two dimensions or higher as an example. However, a decoding method of the present embodiment is not limited to the product code and can be applied to an arbitrary code as long as the code includes a plurality of constraint conditions. For example, the decoding method of the present embodiment can be also applied to a concatenated code or the like.

First, writing processing of the present embodiment will be described. The control unit 23 instructs an encoder 26 to encode data during writing into the non-volatile memory 3. Also, the control unit 23 determines a storage place (storage address) of a code word in the non-volatile memory 3 and gives an instruction to the memory I/F 22. Based on the instruction from the control unit 23, the encoder 26 encodes data on the data buffer 25 and generates a code word. The memory I/F 22 performs control to store the code word into the storage place on the non-volatile memory 3 which place is instructed by the control unit 23.

Figure 2:
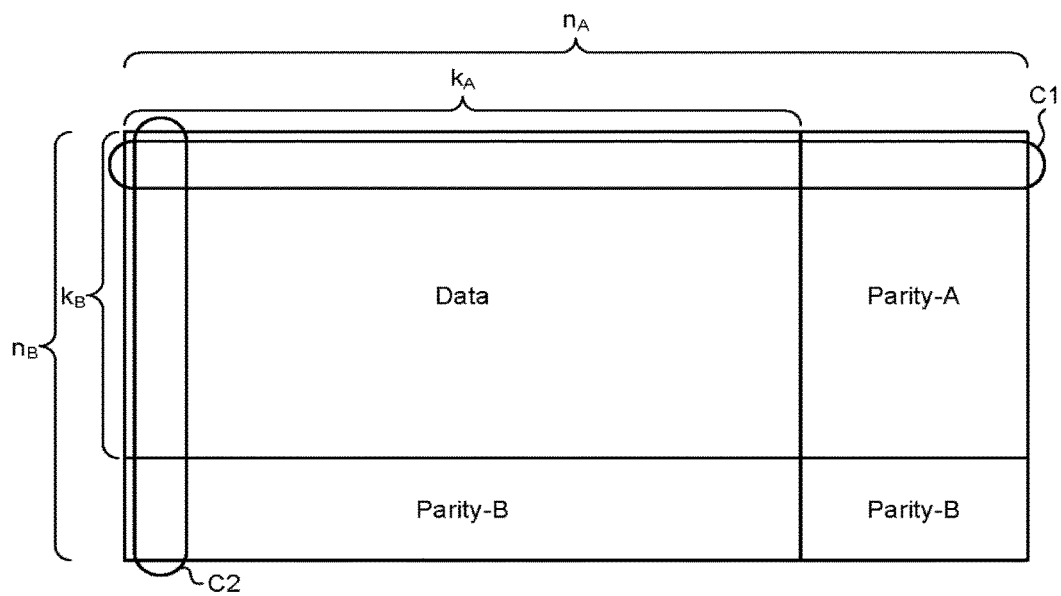
FIG. 2 is a view illustrating a configuration example of a product code according to the embodiment.

The encoder 26 generates, for example, a product code. FIG. 2 is a view illustrating a configuration example of a product code according to the present embodiment. In FIG. 2, an example of using a two-dimensional product code is illustrated. In the example in FIG. 2, the product code includes a code word group in two dimensions which are a first dimension (row direction, that is, horizontal direction in FIG. 2) and a second dimension (column direction, that is, vertical direction on plane of paper in FIG. 2). There is a plurality of code words (row code word) in the first dimension and a plurality of code words (column code word) in the second dimension which code words are included in the product code. However, in FIG. 2, a reference sign is only assigned to each of one code word in the first dimension C1 and one code word in the second dimension C2. Data in FIG. 2 is user data. Note that when control data or the like, which is other than the user data and which is used in the memory controller 2, is protected by the same product code with the user data, the Data is the control data or the like protected by the product code. A code length of each code word in the first dimension is $n_A$ bit and an information bit of each code word in the first dimension is $k_A$ bit. Also, a redundancy bit of each code word in the first dimension, that is, a Parity-A is $(n_A-k_A)$ bit. A code length of each code word in the second dimension is $n_B$ bit and an information bit of each code word in the second dimension is $k_B$ bit. Also, a redundancy bit of each code word in the second dimension, that is, a Parity-B is $(n_B-k_B)$ bit. Also, a cyclic redundancy check (CRC) bit may be added as a redundancy bit of an error detection code. In the following, all code word groups illustrated in FIG. 2 will be referred to as a product code.

In the following procedure, the product code illustrated in FIG. 2 is generated. Then encoder 26 generates the Parity-A having $(n_A-k_A)$ bit by performing error correction encoding (first encoding) of data having $k_A$ bit in order to generate a code word in the first dimension. Here, $n_A$ is a code length of a code word in the first dimension. Also, the encoder 26 generates the Parity-B having $(n_B-k_B)$ bit by performing error correction encoding (second encoding) of data having $k_B$ bit in order to generate a code word in the second dimension. Here, $n_B$ is a code length of a code word in the second dimension. Also, the encoder 26 generates the Parity-B by performing encoding (second encoding) of data having $k_B$ bit. Data encoded in the first encoding and the second encoding are user data received from the host 4 and a CRC bit (redundancy bit of CRC) generated based on the user data. Also, data which is other than the user data received from the host 4 and which is, for example, data used for control in the memory controller 2 may be a target of the first encoding and the second encoding. As an error correction code used in each of the first encoding and the second encoding, for example, a block code such as a BCH code or an RS code can be used. An error correction code used in the first encoding and that used in the second encoding may be the same or different from each other. As illustrated in FIG. 2, an information bit (including CRC bit when CRC bit is added) included in the product code configures each of the code word in the first dimension and the code word in the second dimension.

A configuration of the code word illustrated in FIG. 2 is an example. A code word to which the decoding method of the present embodiment is applied is not limited to the example in FIG. 2. Also, the above description is made with each of $n_A$, $n_B$, $k_A$, and $k_B$ as the number of bits but each of $n_A$, $n_B$, $k_A$, and $k_B$ may be the number of symbols. As described above, as a code word to which the decoding method of the present embodiment can be applied, a product code in three dimensions or higher or a code other than the product code may be used. Also, in the example in FIG. 2, all bits of data are protected doubly by the code word in the first dimension and the code word in the second dimension. However, al s of the data are not necessarily protected doubly and at least a part of the data needs to be protected doubly.

A storage place of when the product code illustrated in FIG. 2 is stored into the non-volatile memory 3 is not particularly limited. For example, a whole product code is stored into one page. Also, the code word in the first dimension may be stored into one page and a whole product code may be stored into a plurality of pages. Alternatively, a storage method other than these may be used.

Next, processing of reading from the non-volatile memory 3 of the present embodiment will be described. In the reading from the non-volatile memory 3, the control unit 23 instructs the memory I/F 22 to perform reading while designating an address on the non-volatile memory 3 and instructs the decoder 27 to start decoding. According to the instruction from the control unit 23, the memory I/F 22 reads a received word responding to the code word from the non-volatile memory 3. The decoder 27 decodes received word read from the non-volatile memory 3.

Figure 3:
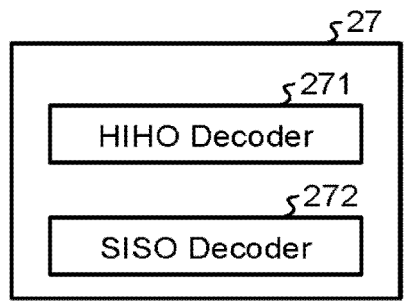
FIG. 3 is a view illustrating a configuration example of a decoder according to the embodiment.

FIG. 3 is a view illustrating a configuration example of the decoder 27 of the present embodiment. As illustrated in FIG. 3, the decoder 27 includes a hard determination decoder (HIHO decoder) 271 and a soft determination decoder (SISO decoder) 272. In the present embodiment, it is assumed that a code word in each dimension is generated by an encoding method in which the HIHO decoding can be performed. First, the HIHO decoding is performed. When error correction by the HIHO decoding is failed, the SISO decoding is performed.

Figure 4:
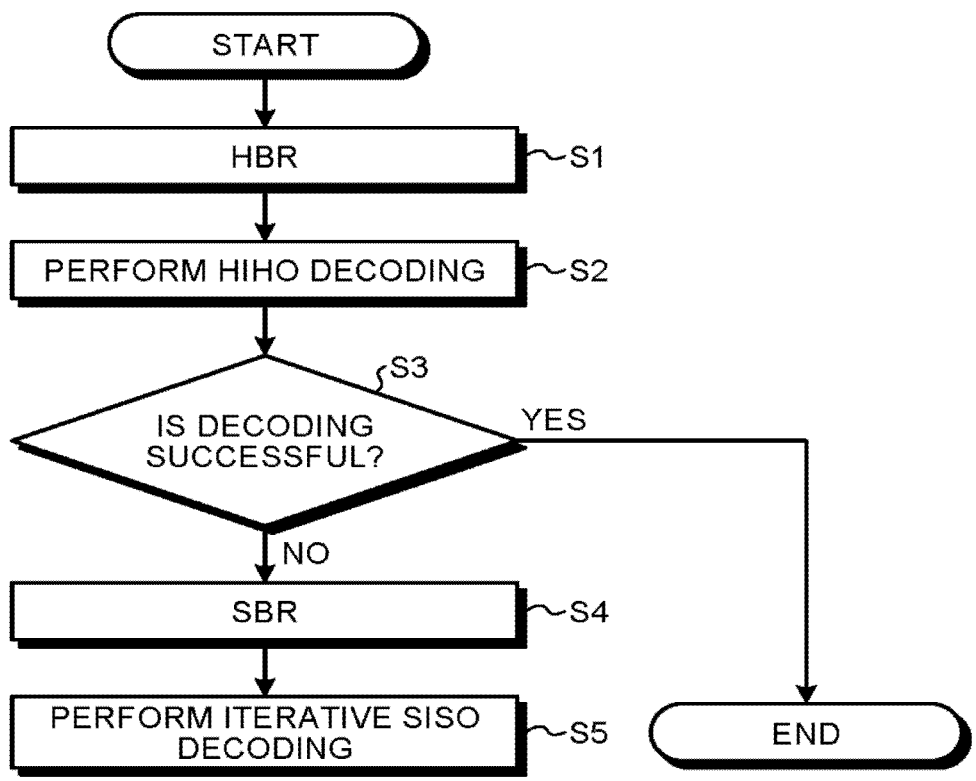
FIG. 4 is a flowchart illustrating an example of a reading processing procedure according to the embodiment.

FIG. 4 is a flowchart illustrating an example of a reading processing procedure according to the present embodiment. The control unit instructs the memory I/F 22 to perform reading from the non-volatile memory 3 by hard bit read (HBR) while designating an address to be read and the memory I/F 22 executes the hard bit read (step S1). The hard bit read a reading method to read each bit included in a code word as hard determination information of zero or one. The read code word (hard determination information) is stored into the data buffer 25. Note that here, an example in which the read code word (hard determination information) is stored into the data buffer 25 is illustrated. However, a buffer to store the code word (hard determination information) may be provided the decoder 27 and the code word (hard determination information) may be stored into the buffer.

In a case where the non-volatile memory 3 is a NAND memory, in the writing of data, an electron is injected according to a data value in such a manner that the number of electrons (charge amount) in a floating gate corresponds to any of a plurality of distributions (threshold distribution). Here, to simplify a description, an example of one bit/cell in which one memory cell stores one bit will be described. In a case of one bit/cell, one of two distributions corresponds to "0" and the other corresponds to "1". When voltage is applied to a memory cell, in a case where voltage equal to or higher than a current value corresponding to a charge amount of the memory cells is applied, current flows and in a case where voltage lower than the voltage is applied, current does not flow. Thus, voltage to be a boundary is determined for each memory cell according to a charge amount of the memory cell. Here, the voltage determined according to a charge amount of the memory cell is referred to as a threshold voltage (Vth). By injecting charge in such a manner as to correspond to either of the two threshold distributions in an initial state and by applying, to the memory cell, a reference read voltage which separates the two threshold distributions from each other in reading, it is possible to determine whether data stored in the memory cell is one.

The hard bit read is reading in which the non-volatile memory 3 applies a reference read voltage to a memory cell, determines whether data stored in the memory cell is 1 or 0, and outputs a determined result. Note that a read voltage applied in the hard bit read may be changed from the reference read voltage.

Referring back to the description in FIG. 4, the control unit 23 instructs the decoder 27 to perform the HIHO decoding and the decoder 27 performs the HIHO decoding on the product code stored in the data buffer 25 (step S2). More specifically, the HIHO decoder 271 performs HIHO decoding of the product code stored in the data buffer 25 by using the hard determination information read from the data buffer 25.

In the HIHO decoding, decoding such as limit distance decoding is performed with respect to a code word input as the hard determination information. The HIHO decoding performed by the HIHO decoder 271 is not limited to the limit distance decoding and any kind of HIHO decoding may be used. In a case of using the product code illustrated in FIG. 2 as an example, first, the HIHO decoder 271 corrects an error which can be corrected in decoding of a code word in the first dimension, in which decoding each code word in the first dimension included in the product code is serially decoded, and decodes a code word in the second dimension. An error which can be corrected in the decoding of the code word in the second dimension is corrected and a code word in the first dimension is decoded again. As described above, processing to iteratively perform decoding of a code word in the first dimension and a code word in the second dimension, that is, iterative decoding processing is performed. Note that a detail processing procedure to perform the HIHO decoding of a product code is not limited to the above-described procedure and may be a procedure other than the above-described procedure such as a procedure of not performing iteration.

After step S2, the HIHO decoder 271 determines whether decoding of all code words included in the product code is successful and notifies a determination result thereof to the control unit 23. Based on the notice from the HIHO decoder 271, the control unit 23 determines whether decoding of all code words included in the product code is successful (step S3). In a case where the decoding of all code words is successful (step S3 Yes), the reading processing is ended. Note that in step S3, the control unit 23 determines whether decoding of all code words in at least one dimension which words are included in the product code is successful. Also, in a case where a redundancy bit of an error detection code such as a CRC bit is added, in the determination whether the decoding is successful in step S3, a check using an error detection code may be used together.

When it is determined that there is a failure in decoding of the code words included in the product code (step S3 No), the control unit 23 instructs the memory I/F 22 to perform reading from the non-volatile memory 3 by soft bit read (SBR) while designating an address to be read and the memory I/F 22 executes the soft bit read which is reading to perform reading as soft determination information (step S4).

In the present embodiment, an input of the SISO decoding in the SISO decoder 272 is a code word read from the non-volatile memory 3 by the soft bit read. In the soft bit read, a logarithm ratio of a probability (or likelihood) of zero and a probability (or likelihood) of one calculated based on information of a range of a threshold voltage of a memory cell in the non-volatile memory 3, that is, an Log-likelihood ratio (LLR) is acquired. As described above, in the present embodiment, it is assumed that channel information is an LLR acquired by the soft hit read.

Also, in a case where a logarithm ratio of a probability in which a value stored in the non-volatile memory 3 is zero and a probability in which the value is one is already known, the logarithm ratio is referred to as priori information. The SISO decoder 272 performs decoding of each code word in each dimension with the channel information, that is, the LLR and the priori information as an input. That is, the SISO decoder 272 calculates the most likely code word in code words which satisfy a code constraint with the channel information, that is, the LLR and the priori information as an input. By decoding of the code word in each dimension performed by the SISO decoder 272, a logarithm ratio of a probability in which each bit of the code word is zero and a probability in which each bit of the code word is one, that is, a log a posteriori probability ratio is acquired. As described above, in the present embodiment, the log a posteriori probability ratio is referred to as a posteriori information.

Figure 5:
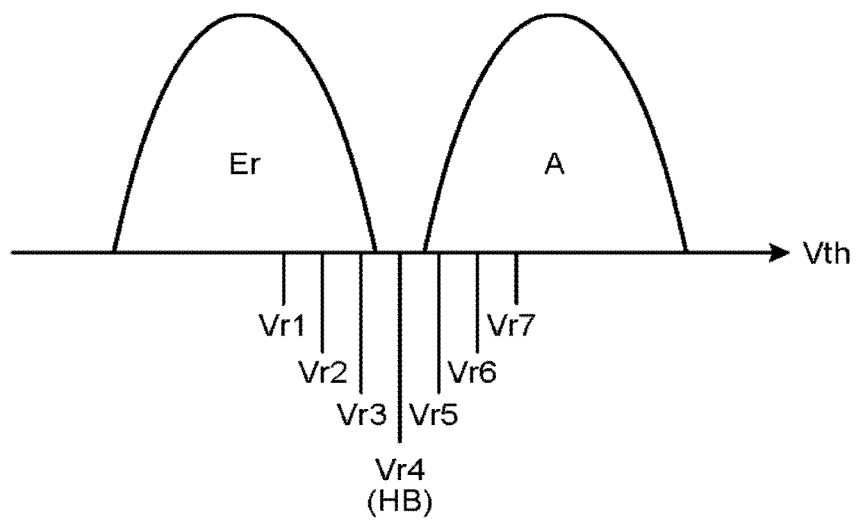
FIG. 5 is a view for describing soft bit read.

FIG. 5 is a view for describing the soft bit read. A horizontal axis in FIG. 5 indicates a threshold voltage and a vertical axis indicates a frequency. In FIG. 5, an example of a single-level cell which stores one bit/cell is illustrated. Here, Erase (Er) distribution on a left side corresponds to a data value 1 and an A distribution on a right side corresponds to a data value 0. In the soft bit read, reading is performed by a plurality of read voltages on both sides of a reference read voltage in addition to the reference read voltage used in the hard bit read. In the example in FIG. 5, an example performing the soft bit read by seven read voltages in total is illustrated. A read voltage described as Vr4 (HD) indicates a reference read voltage used in the hard bit read. In the soft bit read, reading is performed by using seven read voltages in total. That is, Vr1, Vr2, and Vr3 each of which is lower than Vr4, and Vr5, Vr6, and Vr7 each of which is higher than Vr4 are used in addition to Vr4. Note that the number of read voltages in the soft bit read is not limited to seven.

Figure 6:
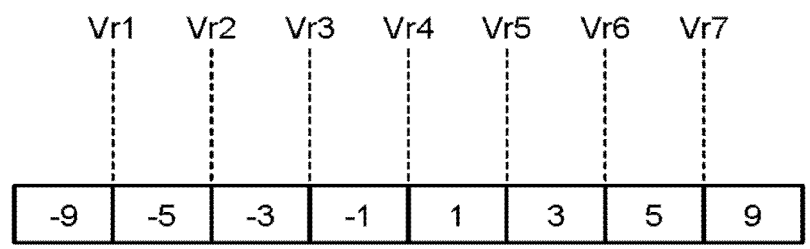
FIG. 6 is a view illustrating an example of an LLR table.

Then, for example, by using the LLR table, an LLR can be calculated from a result of determination whether a threshold voltage of each memory cell is equal to or higher than each read voltage. FIG. 6 is a view illustrating an example of the LLR table. For example, when it is determined that a threshold voltage in a memory cell is lower than Vr1, the LLR is −9 and when it is determined that a threshold voltage of the memory cell is equal to or higher than Vr1 and lower than Vr2, the LLR is −5. FIG. 6 is an example and the LLR table is not limited to the example in FIG. 6. Also, the LLR may be calculated by using a calculation formula instead of the LLR table. In the present embodiment, processing until performance of the soft bit read and conversion into the LLR is referred to as reading of data from the non-volatile memory 3 as soft determination information.

The conversion into the LLR from a result of determination whether a threshold voltage of each memory cell is equal to or higher than each read voltage may be performed by the memory controller 2 or by the non-volatile memory 3. For example, in a case where the conversion is performed by the memory controller 2, the non-volatile memory 3 outputs, with respect to each memory cell, information indicating which of eight regions a threshold voltage is in. The eight regions are a region lower than Vr1, a region equal to or higher than Vr1 and lower than Vr2, a region equal to or higher than Vr2 and lower than Vr3, a region equal to or higher than Vr3 and lower than Vr4, a region equal to or higher than Vr4 and lower than Vr5, a region equal to higher than Vr5 and lower than Vr6, a region equal to or higher than Vr6 and lower than Vr7, and a region equal to or higher than Vr7. Then, the memory I/F 22 calculates the LLR based on the LLR table and the information output from the non-volatile memory 3 and outputs the calculated LLR to the decoder 27.

Note that in each of FIG. 5 and FIG. 6, an example of the single-level cell which stores one bit/cell has been described. However, similarly to the example of the single-level cell, in a case of a multi-level cell, reading is performed by a plurality of read voltages with respect to each boundary in a threshold distribution. Then, based on a result of the reading by the plurality of read voltages, an LLR is calculated.

Referring back to the description of FIG. 4, the control unit 23 instructs the decoder 27 perform iterative SISO decoding to iteratively perform SISO decoding of a code in the first dimension and SISO decoding of a code in the second dimension and the decoder 27 performs the iterative SISO decoding (step S5). More specifically, the SISO decoder 272 performs SISO decoding of a product code input as the LLR. A detail of the iterative SISO decoding will be described later.

When it is possible to perform error correction in the hard bit read and the FIFO decoding by performing the above-described processing, the decoding is ended by performance of the hard bit read and the HIHO decoding and high-speed reading can be performed. On the other hand, when it is not possible to perform error correction in the hard bit read and the HIHO decoding, an error correction capability can be improved by performing the SISO decoding with a high correction capability. Note that in the present embodiment, first, the hard bit read and the HIHO decoding are performed. In a case where it is not possible to correct an error in the hard bit read and the HIHO decoding, the soft bit read and the SISO decoding are performed. However, the soft bit read and the SISO decoding may be performed from the beginning without performing the hard bit read and the HIHO decoding.

Figure 7:
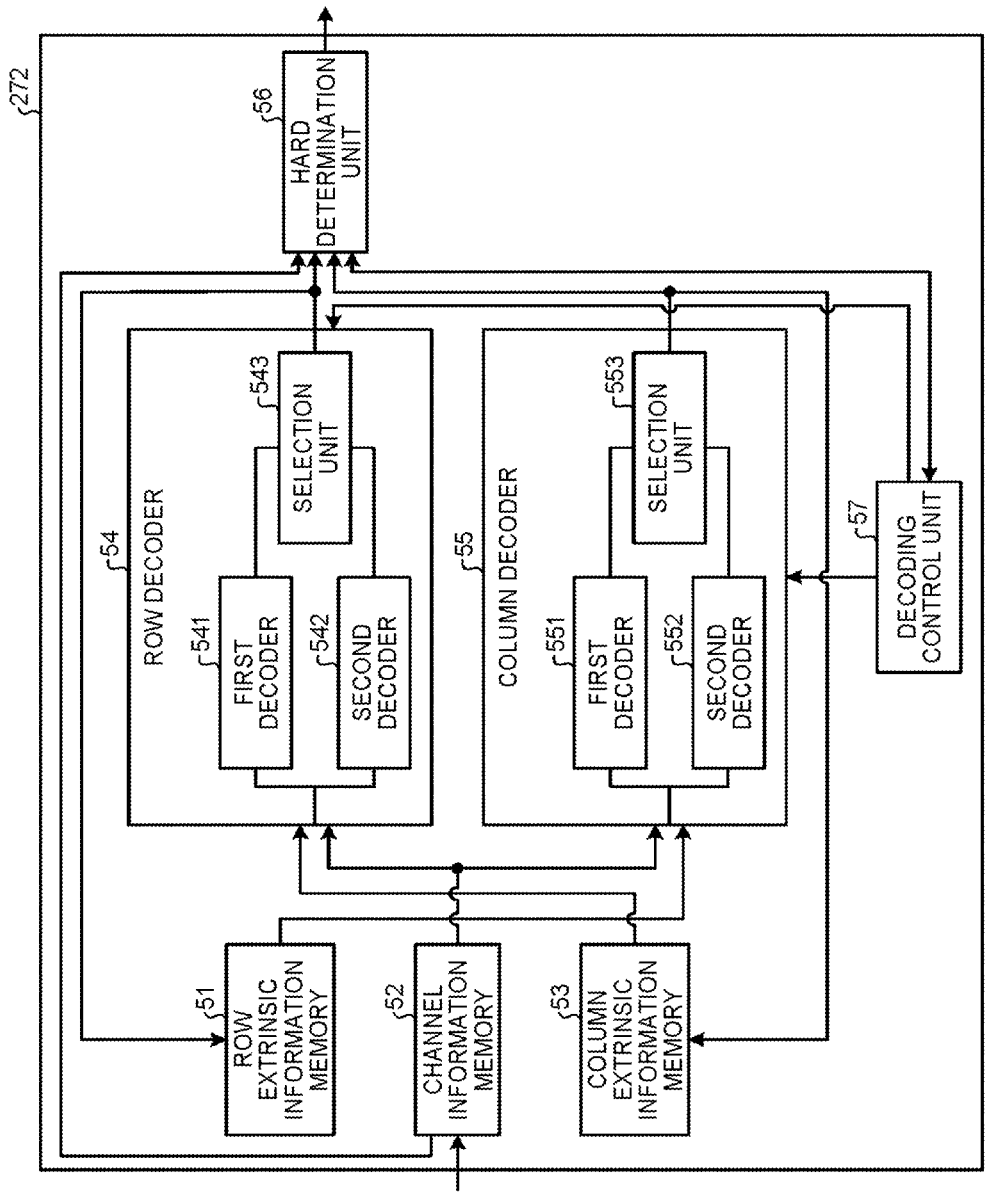
FIG. 7 is a view illustrating a configuration example of an SISO decoder.

Next, the SISO decoding of the present embodiment will be described. FIG. 7 is a view illustrating a configuration example of the SISO decoder 272. As illustrated in FIG. 7, the SISO decoder 272 includes a row extrinsic information memory 51, a channel information memory 52, a column extrinsic information memory 53, a row decoder 54, a column decoder 55, a hard determination unit. 56, and a decoding control unit (end determination unit) 57. The row decoder 54 includes a first decoder 541 which is a first row decoder, a second decoder 542 which is a second row decoder, and a selection unit 543. The column decoder 55 includes a first decoder 551 which is a first column decoder (third decoder), a second decoder 552 which is a second column decoder (fourth decoder), and a selection unit 553. In the following, the SISO decoding will be also simply referred to as soft determination decoding.

The row decoder 54 performs the SISO decoding of a code word in the first dimension and the column decoder 55 performs the SISO decoding of a code word in the second dimension. The first decoder 541 and the second decoder 542 are decoders to perform the SISO decoding by different decoding methods. The decoding executed by the first decoder 541 and the decoding executed by the second decoder 542 have complementary properties. As described above, the chase decoding has a high correction capability in a channel in which an error with large amplitude is generated frequently. Thus, for example, when it is assumed that the first decoder 541 performs the chase decoding, a decoder having a high correction capability in a channel in which an error with large amplitude is not generated frequently is used as the second decoder 542.

Similarly, the first decoder 551 and the second decoder 552 in column decoder 55 are decoders to perform the SISO decoding by different decoding methods. The decoding executed by the first decoder 551 and the decoding executed by the second decoder 552 have complementary properties.

In the present embodiment, the SISO decoder 272 performs decoding by using extrinsic information, which is acquired in a different dimension, as a priori information. For example, the row decoder 54 uses, for decoding of a code word in the first dimension, extrinsic information (extrinsic information in second dimension) which is acquired by decoding of a code word in the second dimension and which is stored in the column extrinsic information memory 53. Also, the column decoder 55 uses, for decoding of a code word in the second dimension, extrinsic information (extrinsic information in first dimension) which is acquired by decoding of a code word in the first dimension and which is stored in the row extrinsic information memory 51.

Figure 8:
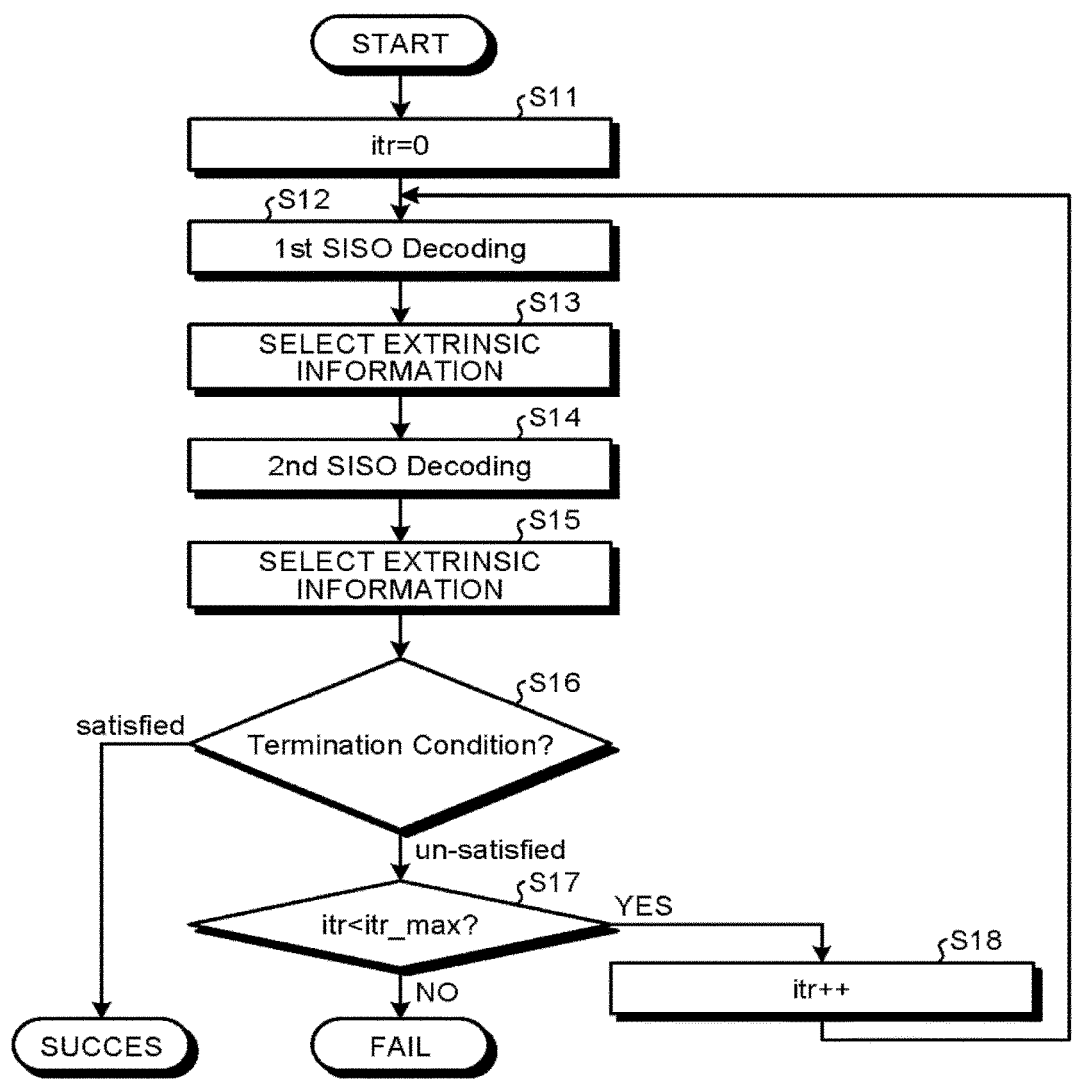
FIG. 8 is a flowchart illustrating an example of an iterative SISO decoding processing procedure according to the embodiment.

FIG. 8 is a flowchart illustrating an example of an iterative SISO decoding processing procedure according to the present embodiment. First, when being instructed by the control unit 23 to start the SISO decoding, the decoding control unit 57 initializes a counter itr of the number of times of iteration of the SISO decoding into zero (step S11). Next, the SISO decoder 272 performs first SISO decoding processing (row decoding processing) with respect to a code word group in the first dimension which group included in a product code (step S12).

More specifically, the following processing performed. The decoding control unit 57 instructs the row decoder 54 to perform decoding. When receiving the instruction from the decoding control unit 57, each of the first decoder 541 and the second decoder 542 in the row decoder 54 reads, from the channel information memory 52, an LLR corresponding to each bit of each code word in the first dimension which word is included in the product code. Also, each of the first decoder 541 and the second decoder 542 reads, from the column extrinsic information memory 53, extrinsic information which is acquired as a result of ISO decoding in the second dimension and which corresponds to each hit of each code word in the first dimension. Each of the first decoder 541 and the second decoder 542 uses the read extrinsic information as a priori information in SISO decoding of a row received word (row soft input information) which is a received word (soft input information) corresponding to each code word in the first dimension. However, in a case of the first time in iterative processing (in case of itr=0), the priori information is a previously-set value (such as 0). Then, each of the first decoder 541 and the second decoder 542 performs SISO decoding of each received word in the first dimension by using the LLR and the priori information and calculates extrinsic information and a decoded word vector D={$d_1$, $d_2$, . . . , $d_n$}.

Also, as expressed in the following equation (1), each of the first decoder 541 and the second decoder 542 calculates a square Euclidean distance between a received word vector R (channel information or result of addition of channel information and priori information) and a decoded word or calculates distance information expressed in an equation (2) described later. The distance information is information indicating accuracy of a decoded result. Here, indicates a jth element of the received word vector R={$r_1$, $r_2$, . . . , $r_n$}.

$$\sum (R-D)^2 = \sum_{i=0}^{n-1} r_i^2 + n - 2 \sum_{i=0}^{n-1} |r_i| + 4 \sum_{r_i d_i < 0} |r_i| \qquad (1)$$

Note that each of values other than the last member on a right side of the above equation (1) is value determined only by a received word and a code length and does not depend on a decoded word (decoded result). Thus, in the present embodiment, as expressed in the following equation (2), it is defined that the last member on the right side of the equation (1) which member depends on a decoded word is distance information Dist and the distance information Dist is calculated. The distance information expressed in the equation (2) is the sum of absolute values of channel information of a bit in which a code of a decoded word and that of a received word are different from each other, that is, a bit corrected with respect to the received word. Note that here, it is assumed that the distance information is the sum of absolute values of channel information of a bit corrected with respect to a received word. However, distance information only needs to be the sum of values proportional to an absolute value of channel information of a bit corrected with respect to a received word.

$$Dist = \sum_{r_i d_i < 0} |r_i| \qquad (2)$$

Each of the first decoder 541 and the second decoder 542 inputs, to the selection unit 543, extrinsic information and distance information acquired by the SISO decoding. However, when a decoded word is not acquired by the SISO decoding, each of the first decoder 541 and the second decoder 542 sets a maximum value in a system as the distance information and a zero vector as the extrinsic information.

Next, the selection unit 543 selects extrinsic information based on the distance information input from the first decoder 541 and the distance information input from the second decoder 542 (step S13). More specifically, the selection unit 543 compares the distance information input from the first decoder 541 and the distance information input from the second decoder 542, selects an extrinsic information input from a decoder with smaller distance information, and stores the selected extrinsic information into the row extrinsic information memory 51.

Next, the SISO decoder 272 performs second SISO decoding (column decoding processing) with respect to a code word group in the second dimension which group is included in a product code (step S14). More specifically, the following processing is performed. The decoding control unit 57 instructs the column decoder 55 to perform decoding. When receiving the instruction from the decoding control unit 57, each of the first decoder 551 and the second decoder 552 in the column decoder 55 reads, from the channel information memory 52, an LLR corresponding to each bit of each code word in the second dimension which word is included in the product code. Also, each of the first decoder 551 and the second decoder 552 reads, from the row extrinsic information memory 51, the extrinsic information which is acquired as a result of the SISO decoding in the first dimension and which corresponds to each hit of each code word in the second dimension. Each of the first decoder 551 and the second decoder 552 uses the read extrinsic information as a priori information in the SISO decoding of a received word in the second dimension (column soft input information) which is a received word (soft input information) corresponding to each code word in the second dimension. That is, each of the first decoder 551 and the second decoder 552 performs the SISO decoding of each received word in the second dimension by using the LLR and the priori information and calculates extrinsic information and a decoded word. Also, each of the first decoder 551 and the second decoder 552 calculates distance information based on the above-described equation (2). Each of the first decoder 551 and the second decoder 552 inputs, to the selection unit 553, the extrinsic information and the distance information acquired by the SISO decoding.

Next, the selection unit 553 selects extrinsic information based on the distance information input from the first decoder 551 and the distance information input from the second decoder 552 (step S16). More specifically, the selection unit 553 compares the distance information input from the first decoder 551 and the distance information input from the second decoder 552, selects an extrinsic information input from a decoder with smaller distance information, and stores the selected extrinsic information into the column extrinsic information memory 53.

Next, the SISO decoder 272 determines whether to end the iterative SISO decoding (step S17). As a termination condition here, for example, a hard determination result of the posteriori information can be used. In this case, for example, each of the selection unit 543 and the selection unit 553 outputs extrinsic information to the hard determination unit 56. The hard determination unit 56 sets, as a posteriori information, information in which channel information and two kinds of extrinsic information are added to each other. Then, the hard determination unit 56 performs hard determination of the posteriori information and outputs the determined information to the decoding control unit. Then, the decoding control unit 57 can use, as a termination condition, a parity check of a code word in the first dimension being satisfied, a parity check of a code word in the second dimension being satisfied, or a check of an error detection code being satisfied in a case where a redundancy bit, such as a CRC bit, of the error detection code is added. Alternatively, a combination of two or more of the above checks can be used.

When determining to end the iterative SISO decoding (step S14 satisfied), the SISO decoder 272 determines that the decoding is successful and ends the SISO decoding. When it is determined that a termination determination condition is not satisfied (step S16 unsatisfied), the decoding control unit 57 determines whether the counter itr of the number of times of iteration of the iterative SISO decoding is smaller than the maximum number of times of iteration itr_max of the SISO decoding (step S17). When itr is smaller than itr_max (step S17 Yes), the decoding control unit 57 increases itr by one (step S18) and goes back to step S12. When itr is equal to or larger than itr_max (step S17 No), it is determined that the decoding is failed and the iterative SISO decoding is ended.

Note that in the above-described example, each of the first decoder 541 and the second decoder 542 calculates extrinsic information and a decoded word acquired by the SISO decoding and calculates distance information based on the decoded word and the selection unit 543 selects extrinsic information output from a decoder with smaller distance information. However, instead of this, the processing may be performed in the following procedure. First, each of the first decoder 541 and the second decoder 542 calculates a decoded word. Then, based on the decoded word, distance information is calculated and output to the selection unit 543. The selection unit 543 instructs a decoder with smaller distance information to generate extrinsic information. Then, the instructed decoder calculates extrinsic information and stores the calculated extrinsic information into the row extrinsic information memory 51. Similarly, first, each of the first decoder 551 and the second decoder 552 calculates a decoded word. Then, based on the decoded word, distance information is calculated and output to the selection unit 553. The selection unit 553 instructs a decoder with smaller distance information to generate extrinsic information. Then, the instructed decoder calculates extrinsic information and stores the calculated extrinsic information into the column extrinsic information memory 53.

Note that in the configuration example illustrated in FIG. 7, a case where two decoders with different decoding methods are included in each dimension has been described. However, in each dimension, three or more decoders with different decoding methods may be included and what is accurate may be selected from three or more decoded results. Also, the number of decoders may vary in dimensions. That is, for example, one decoder is included in the first dimension (row direction) and two decoders are included in the second dimension (column direction).

Figure 9:
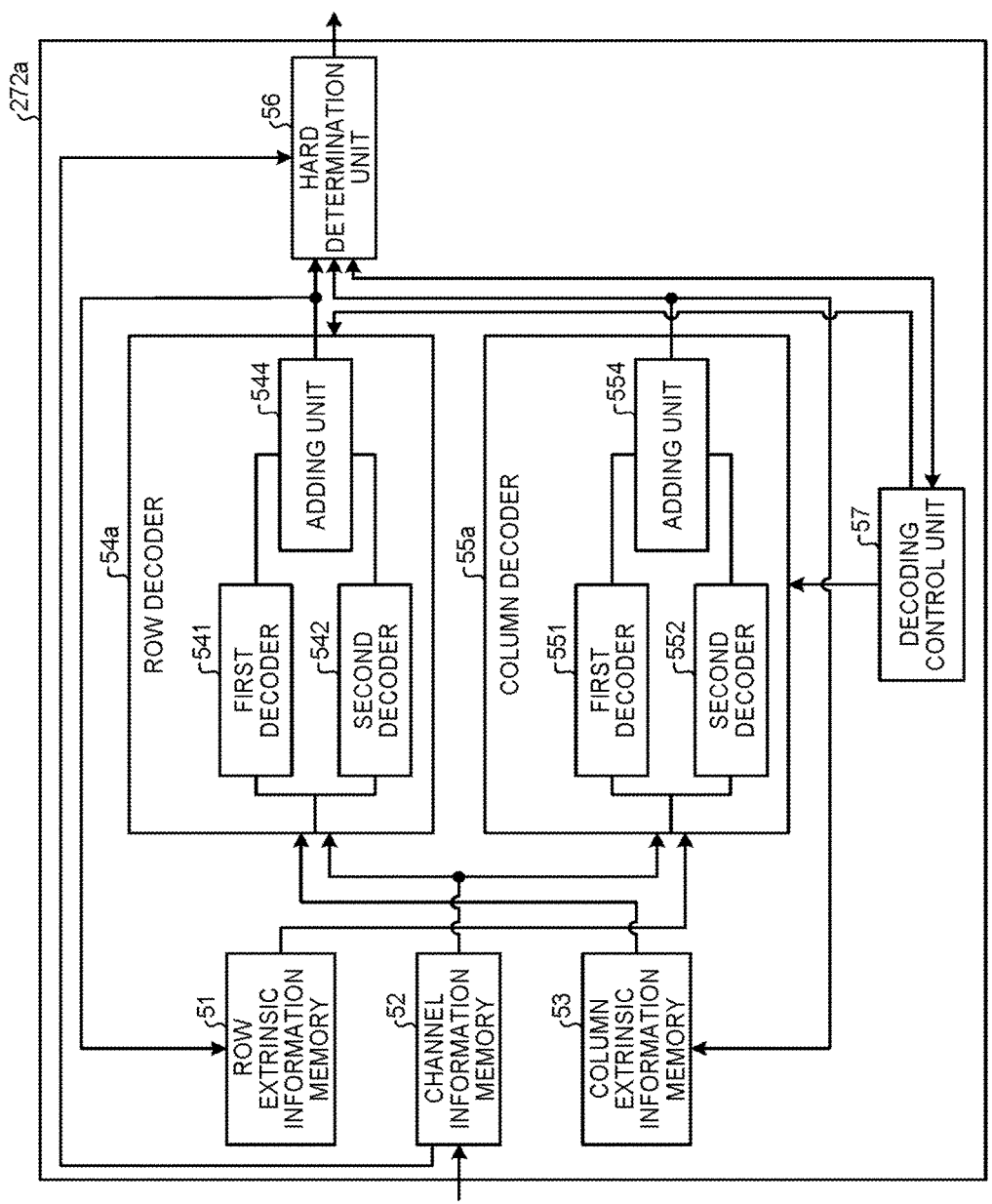
FIG. 9 is a view illustrating a configuration example of an SISO decoder in a case of adding extrinsic information output from two decoders.

Also, in the above-described example, either one is selected from extrinsic information output from the two decoders. However, the extrinsic information output from the two decoders may be added. FIG. 9 is a view illustrating a configuration example of an SISO decoder 272a in a case of adding extrinsic information output from two decoders. A configuration of a storage apparatus in this case is similar to the storage apparatus 1 in FIG. 1 other than a point of switching the SISO decoder 272 into the SISO decoder 272a.

The SISO decoder 272a is similar to the SISO decoder 272 other than a point that the row decoder 54 and the column decoder 55 are switched into a row decoder 54a and a column decoder 55a. The row decoder 54a includes a first decoder 541 and a second decoder 542 similar to those of the row decoder 54. However, each of the first decoder 541 and the second decoder 542 does not need to output distance information. An adding unit 544 adds extrinsic information output from the first decoder 541 to extrinsic information output from the second decoder 542 and stores a result of adding into a row extrinsic information memory 51. The column decoder 55a includes a first decoder 551 and a second decoder 552 similar to those of the column decoder 55. However, each of the first decoder 551 and the second decoder 552 does not need to output distance information. An adding unit 554 adds extrinsic information output from the first decoder 551 to extrinsic information output from the second decoder 552 and stores a result of adding into a column extrinsic information memory 512.

As described above, in the present embodiment, in a case of decoding a product code in two dimensions iteratively, a plurality of decoders with different decoding methods is included in each dimension. What having high accuracy is selected from decoded results by the plurality of decoders and extrinsic information calculated from the selected decoded result is used as a priori information in decoding in a different dimension. Accordingly, an error correction capability can be improved.

While certain embodiments have been described, these embodiments have been presented by way of example only, and are not intended to limit the scope of the inventions, indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:
a row decoder configured to perform row decoding by using a first received word as row soft input information and to calculate row extrinsic information based on decoded result of the row decoding, the first received word corresponding to a row code word read as soft determination information from a non-volatile memory, the row decoding being decoding of the first received word; and
a column decoder configured to perform column decoding by using column soft input information and to calculate column extrinsic information based on a decoded result of the column decoding, the column soft input information being a result of adding of the row extrinsic information to a column received word corresponding to a second code word, the second received word read as soft determination information from the non-volatile memory, the column decoding being decoding of the second received word, wherein
the row decoder includes:
a first decoder configured to perform first decoding by using the row soft input information;
a second decoder configured to perform second decoding by using the row soft input information, the second decoding having a decoding method different from a decoding method of the first decoding; and
a selection unit configured to select one of a decoded result of the first decoding and a decoded result of the second decoding based on accuracy of the decoded result of the first decoding and accuracy of the decoded result of the second decoding and to calculate the row extrinsic information based on the selected decoded result.

2. The memory controller according to claim 1, further comprising an end determination unit configured to determine whether to end the row decoding and the column decoding, wherein
each of the row decoder and the column decoder iterates the row decoding and the column decoding alternately until the end determination unit determines to end the row decoding and the column decoding,
the row decoder uses a result of adding of the first received word to the column extrinsic information as the row soft input information when the column extrinsic information is calculated, and
the column decoder includes:
a third decoder configured to perform third decoding by using the column soft input information;
a fourth decoder configured to perform fourth decoding by using the column soft input information, the fourth decoding having a decoding method different from a decoding method of the third decoding; and
a column extrinsic information selection unit configured to select one of a decoded result of the third decoding and a decoded result of the fourth decoding based on accuracy of the decoded result of the third decoding and accuracy of the decoded result of the fourth decoding and to calculate the column extrinsic information based on the selected decoded result.

3. The memory controller according to claim 2, wherein each of the first decoding and the third decoding is decoding having a high correction capability in a channel in which an error with large amplitude is generated frequently, and each of the second decoding and the fourth decoding is decoding having a high correction capability in a channel in which an error with large amplitude is not generated frequently.

4. The memory controller according to claim 3, wherein each of the first decoding and the third decoding is chase decoding.

5. The memory controller according to claim 2, wherein the accuracy of the decoded result of the first decoding is information indicating a square Euclidean distance between the decoded result of the first decoding and the row soft input information, the accuracy of the decoded result of the second decoding is information indicating a square Euclidean distance between the decoded result of the second decoding and the row soft input information, accuracy of a decoded result of the third decoding is information indicating a square Euclidean distance between the decoded result of the third decoding and the row soft input information, and accuracy of a decoded result of the fourth decoding is information indicating a square Euclidean distance between the decoded result of the fourth decoding and the row oft input information.

6. The memory controller according to claim 2, wherein the accuracy of the decoded result of the first decoding is a value in which values respectively proportional to absolute values of the row soft input information in all bits corrected in the decoded result of the first decoding are added, the accuracy of the decoded result of the second decoding is a value in which values respectively proportional to absolute values of the row soft input information in all bits corrected in the decoded result of the second decoding are added, accuracy of a decoded result of the third decoding is a value in which values respectively proportional to absolute values of the row soft input information in all bits corrected in the decoded result of the third decoding are added, and accuracy of a decoded result of the fourth decoding is a value in which values respectively proportional to absolute values of the row soft input information in all bits corrected in the decoded result of the fourth decoding are added.

7. The memory controller according to claim 1, wherein the row code word is a code word in a first dimension included in a product code, and a column code word is a code word in a second dimension included in the product code.

8. A storage apparatus comprising:
a non-volatile memory;
a row decoder configured to perform row decoding by using a first received word as row soft input information and to calculate row extrinsic information based on a decoded result of the row decoding, the first received word corresponding to a row code word read as soft determination information from the non-volatile memory, the row decoding being decoding of the first received word; and
a column decoder configured to perform column decoding by using column soft input information and to calculate column extrinsic information based on a decoded result of the column decoding, the column soft input information being a result of adding of the row extrinsic information to a column received word corresponding to a second code word, the second received word read as soft determination information from the non-volatile memory, the column decoding being decoding of the second received word, wherein
the row decoder includes:
a first decoder configured to perform first decoding by using the row soft input information;

a second decoder configured to perform second decoding by using the row soft input information, the second decoding having a decoding method different from a decoding method of the first decoding; and a selection unit configured to select one of a decoded result of the first decoding and a decoded result of the second decoding based on accuracy of the decoded result of the first decoding and accuracy of the decoded result of the second decoding and to calculate the row extrinsic information based on the selected decoded result.

9. The storage apparatus according to claim 8, further comprising an end determination unit configured to determine whether to end the row decoding and the column decoding, wherein each of the row decoder and the column decoder iterates the row decoding and the column decoding alternately until the end determination unit determines to end the row decoding and the column decoding, the row decoder uses a result of adding of the first received word to the column extrinsic information as the row soft input information when the column extrinsic information is calculated, and the column decoder includes a third decoder configured to perform third decoding by using the column soft input information, a fourth decoder configured to perform fourth decoding by using the column soft input information, the fourth decoding having a decoding method different from a decoding method of the third decoding, and a column extrinsic information selection unit configured to select one of a decoded result of the third decoding and a decoded result of the fourth decoding based on accuracy of the decoded result of the third decoding and accuracy of the decoded result of the fourth decoding and to calculate the column extrinsic information based on the selected decoded result.

10. The storage apparatus according to claim 9, wherein each of the first decoding and the third decoding is decoding having a high correction capability in a channel in which an error with large amplitude is generated frequently, and each of the second decoding and the fourth decoding is decoding having a high correction capability in a channel in which an error with large amplitude is not generated frequently.

11. The storage apparatus according to claim 10, wherein each of the first decoding and the third decoding is chase decoding.

12. The storage apparatus according to claim 9, wherein the accuracy of the decoded result of the first decoding is information indicating a square Euclidean distance between the decoded result of the first decoding and the row soft input information, the accuracy of the decoded result of the second decoding is information indicating a square Euclidean distance between the decoded result of the second decoding and the row soft input information, accuracy of a decoded result of the third decoding is information indicating a square Euclidean distance between the decoded result of the third decoding and the row soft input information, and accuracy of a decoded result of the fourth decoding is information indicating a square Euclidean distance between the decoded result of the fourth decoding and the row soft input information.

13. The storage apparatus according to claim 9, wherein the accuracy of the decoded result of the first decoding is a value in which values respectively proportional to absolute values of the row soft input information in all bits corrected in the decoded result of the first decoding are added, the accuracy of the decoded result of the second decoding is a value in which values respectively proportional to absolute values of the row soft input information in all bits corrected in the decoded result of the second decoding are added, accuracy of a decoded result of the third decoding is a value in which values respectively proportional to absolute values of the row soft input information in all bits corrected in the decoded result of the third decoding are added, and accuracy of a decoded result of the fourth decoding is a value in which values respectively proportional to absolute values of the row soft input information in all bits corrected in the decoded result of the fourth decoding are added.

14. The storage apparatus according to claim 8, wherein the row code word is a code word in a first dimension included in a product code, and a column code word is a code word in a second dimension included in the product code.

15. A decoding method comprising:

reading a first received word as soft determination information from a non-volatile memory, the first received word corresponding to a row code word;

performing row decoding by using the read first received word as row soft input information, the row decoding being decoding of the row received word;

calculating row extrinsic information based on decoded result of the row decoding;

reading a second received word as soft determination information from a non-volatile memory, the second received word corresponding to a column code word;

performing column decoding by using column soft input information which is a result of adding of the row extrinsic information to the second received word, the column decoding being decoding of the second received word; and wherein the row decoding includes, performing first decoding by using the row soft input information, performing second decoding by using the row soft input information, a decoding method of the second decoding being different from that of the first decoding, and selecting one of a decoded result of the first decoding and a decoded result of the second decoding based on accuracy of the decoded result of the first decoding and accuracy of the decoded result of the second decoding; and calculating the row extrinsic information based on the selected decoded result.

16. The decoding method according to claim 15, further comprising:

determining whether to end the row decoding and the column decoding; and iterating the row decoding and the column decoding alternately until the determining determines to end the row decoding and the column decoding, wherein the row decoding uses a result of adding of the first received word to the column extrinsic information as the row soft input information when the column extrinsic information is calculated, and the column decoding includes:

performing third decoding by using the column soft input information;

perform fourth decoding by using the column soft input information, the fourth decoding having a decoding method different from a decoding method of the third decoding;

selecting one of a decoded result of the third decoding and a decoded result of the fourth decoding based on accuracy of the decoded result of the third decoding and accuracy of the decoded result of the fourth decoding; and calculating the column extrinsic information based on the selected decoded result.

17. The decoding method according to claim 16, wherein each of the first decoding and the third decoding is decoding having a high correction capability in a channel in which an error with large amplitude is generated frequently, and each of the second decoding and the fourth decoding is decoding having a high correction capability in a channel in which an error with large amplitude is not generated frequently.

18. The decoding method according to claim 17, wherein each of the first decoding and the third decoding is chase decoding.

19. The decoding method according to claim 16, wherein the accuracy of the decoded result of the first decoding is information indicating a square Euclidean distance between the decoded result of the first decoding and the row soft input information, the accuracy of the decoded result of the second decoding is information indicating a square Euclidean distance between the decoded result of the second decoding and the row soft input information, accuracy of a decoded result of the third decoding is information indicating a square Euclidean distance between the decoded result of the third decoding and the row soft input information, and accuracy of a decoded result of the fourth decoding is information indicating a square Euclidean distance between the decoded result of the fourth decoding and the row soft input information.

20. The decoding method according to claim 16, wherein the accuracy of the decoded result of the first decoding is a value in which values respectively proportional to absolute values of the row soft input information in all bits corrected in the decoded result of the first decoding are added, the accuracy of the decoded result of the second decoding is a value in which values respectively proportional to absolute values of the row soft input information in all bits corrected in the decoded result of the second decoding are added, accuracy of a decoded result of the third decoding is a value in which values respectively proportional to absolute values of the row soft input information in all bits corrected in the decoded result of the third decoding are added, and accuracy of a decoded result of the fourth decoding is a value in which values respectively proportional to absolute values of the row soft input information in all bits corrected in the decoded result of the fourth decoding are added.

* * * * *